United States Patent [19]
Jagadish et al.

[11] Patent Number: 6,012,062
[45] Date of Patent: Jan. 4, 2000

[54] SYSTEM FOR COMPRESSION AND BUFFERING OF A DATA STREAM WITH DATA EXTRACTION REQUIREMENTS

[75] Inventors: Hosagrahar Visvesvaraya Jagadish, Berkeley Heights; Ramarao Kanneganti, Jersey City, both of N.J.; Sundararajarao Sudarshan, Bombay, India

[73] Assignee: Lucent Technologies Inc., Murray Hill, N.J.

[21] Appl. No.: 08/607,983

[22] Filed: Mar. 4, 1996

[51] Int. Cl.[7] .................................................. G06F 17/30
[52] U.S. Cl. ............................................ 707/101; 707/100
[58] Field of Search .................................... 395/611, 612, 395/613, 614, 615, 427, 601, 616; 707/100, 101, 102, 103, 104–200

[56] References Cited

U.S. PATENT DOCUMENTS

| | | | |
|---|---|---|---|
| 5,412,429 | 5/1995 | Glover | 348/398 |
| 5,481,701 | 1/1996 | Chambers, IV | 395/612 |
| 5,551,020 | 8/1996 | Flax et al. | 395/612 |
| 5,592,667 | 1/1997 | Bugajski | 395/613 |
| 5,611,066 | 3/1997 | Keele et al. | 395/427 |

FOREIGN PATENT DOCUMENTS

| | | |
|---|---|---|
| 0 438 955 A1 | 7/1991 | European Pat. Off. . |
| 0 584 992 A2 | 3/1994 | European Pat. Off. . |
| 06161705 | 6/1994 | Japan . |
| 85/01814 | 4/1985 | WIPO . |

*Primary Examiner*—Thomas G. Black
*Assistant Examiner*—Ruay Lian Ho

[57] ABSTRACT

A data base system buffers incoming records according to destination in the disk or non-volatile memory. The data is compressed and transferred to disk when sufficient data has been accumulated for a particular disk destination. Techniques for compressing the compression dictionary as well as the data stream are described.

17 Claims, 4 Drawing Sheets

SYSTEM FOR COMPRESSION AND BUFFERING OF A DATA STREAM WITH DATA EXTRACTION REQUIREMENTS

FIELD OF THE INVENTION

This invention relates to large data base systems, and the like, where records are preferably stored in non-volatile memory in clusters or locations according to content.

BACKGROUND OF THE INVENTION

Many database systems involve an input stream of record data, where each incoming record has to be stored on a disk or other non-volatile memory. Future access will normally be to specified disjoint portions of incoming data stream. If all the data is stored on disk in the order received in the input stream, the records belonging to a particular subject, e.g., a particular customer, will be scattered at random locations on the disk. Retrieval of such data corresponding to a particular subject requires seeks to many different areas of the disk. Seek times on disk are very slow (tens of milliseconds), limiting the number of such operations that a disk can support per second.

To reduce the number of seeks required to retrieve all records corresponding to a particular subject, the records in the input stream are preferably stored in locations on the disk in such a way that records relating to the same subject are clustered in the same area. To achieve this result, the records in the input stream must be efficiently directed to their proper destination on disk. In the abstract, the problem involves routing each record from the input stream to one of several output streams to disk, based on some identifier stored in the record.

Sending each record directly to its destination location on disk can be very costly since each such write requires a seek, which greatly reduces the amount of data that can be handled by the system. On the other hand, writing to a large contiguous area such as a page or, better still, a sequence of pages without intervening seeks is much faster and can run at nearly the full capacity of the disk system. The purpose of the invention is to provide techniques to increase the effective data that can be stored on the disk system by reducing the number of writes and to increase the data handling capacity within the limits of the system hardware.

SUMMARY OF THE INVENTION

Two basic approaches are presented in accordance with the invention. The first approach is to buffer records in main memory (RAM), and write data to disk only when either (a) enough records destined for a particular location in disk have gathered to justify writing them to disk, or (b) the disk to which data is destined is idle. This approach requires an enormous buffer space when used with a very large number of possible destinations on disk (for example, records for hundreds of millions of customers each having a separate destination on disk). In such large systems, according to the invention, the output streams are compressed in memory, and written to disk when sufficient data is accumulated, i.e. a full page or a sequence of several pages. In a second approach, data is routed to its final destination on the disk via a series of intermediate staging areas on disk. By using large contiguous writes, the number of seeks is reduced even though each record may be transferred several times between disk and memory.

In both approaches a single data stream is divided into a large number of data streams which are then compressed and, when sufficient data is collected, stored on disk. Most compression algorithms operate by maintaining a dictionary, and replacing any string in the data stream found in the dictionary by a reference to the dictionary. In systems where only a single data stream is being compressed, maintaining the current dictionary in memory is generally not a problem if the stream being compressed is long compared to the dictionary. In accordance with the invention, however, where the number of data streams being compressed is large and the number of dictionaries must also be large, space in memory for storing all the current dictionaries used in compression can be a serious problem. In accordance with this invention, several techniques are described to compress the dictionary as well as the data stream. Examples illustrating these techniques are as follows:

(1). The dictionary can be partitioned to include a dynamic moving window sub-dictionary and a static sub-dictionary which can be global and stored in memory once for the entire system. The static sub-dictionary can be arranged in a hierarchy which factors out sub-parts that are not common to data streams lower in the hierarchy. Static sub-dictionaries can also be tailored to specific data streams where known data sequences are likely to appear.

(2). The compression algorithm can be applied to the dictionaries using either a global initial dictionary or a smaller dictionary for dictionary compression.

(3). The redundancy of unmatched data sequences that cannot be compressed, and which therefore subsequently appear in both the compressed data stream and the moving window dictionary, can be eliminated in the current dictionary by inserting a pointer to the output stream in place of the unmatched data sequence.

(4). Instead of storing the current dictionary in memory for compressing future incoming data, only that portion of the initial dictionary necessary to reconstruct the current dictionary from the data stream need be stored in memory.

These techniques according to the invention can be employed either separately or in combination to reduce the memory requirements for the current dictionaries being used for compression of the multiple output data streams.

BRIEF DESCRIPTION OF THE DRAWINGS

The following drawings together with the detailed specification disclose preferred embodiments of the invention, wherein.

DETAILED DESCRIPTION OF THE INVENTION

Figure 1:
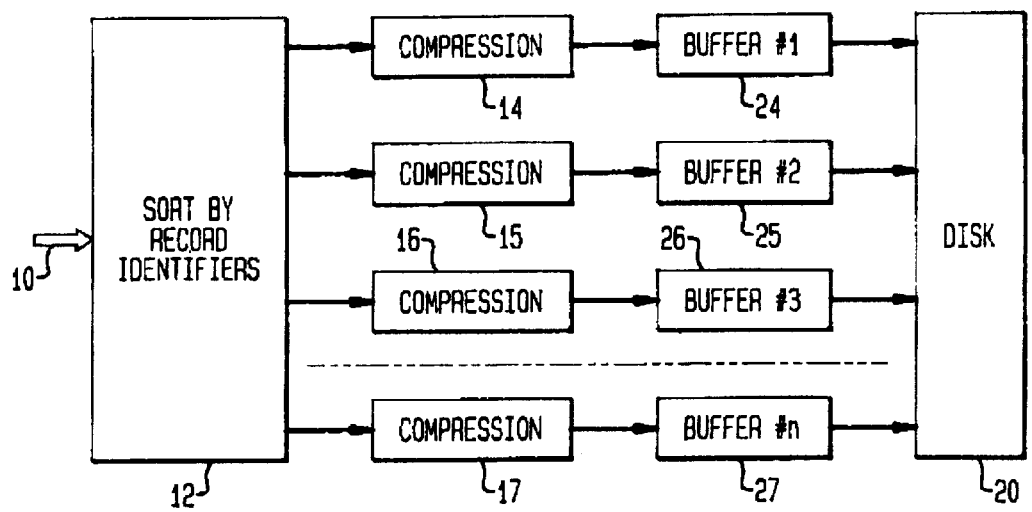
FIG. 1 is a flow diagram illustrating a buffered system where incoming records are accumulated for disk storage.

FIG. 1 is a flow diagram illustrating a buffered database system for storing records on disk at locations according to identifiers contained in the records, for example, according to customer names. Incoming records are accumulated in buffer memories corresponding to the various identifiers and are then transferred to disk when either (a) enough records destined for a particular location have been gathered to justify a write to disk, or (b) the destination disk is idle. As used herein, "memory" refers to main-memory (RAM) in the computer whereas "disk" refers to a disk drive or other non-volatile storage. By accumulating records in buffer memories, many records or pages can be written to disk following a single seek for the record location on disk.

An incoming data stream 10 which contains the records to be stored passes through a sort routine 12. The sort routine separates the incoming records into a number of separate data streams which are temporarily stored in buffer memories 24–27. The separation into separate data streams can be according to any desired identifiers or group of identifiers. The number of buffer memories depends on the number of separate data streams and, in large database systems can be extremely large. The separate data streams are compressed in compression routines 14–17 after being sorted and are then appended to any data which may be stored in the associated buffer memory. Thus, records are routed from an input stream to one of several output streams according to identifiers in the records so that when sufficient data has accumulated, the accumulated data in an output stream can be transferred to a disk 20 with a single seek for location on the disk.

Figure 2:
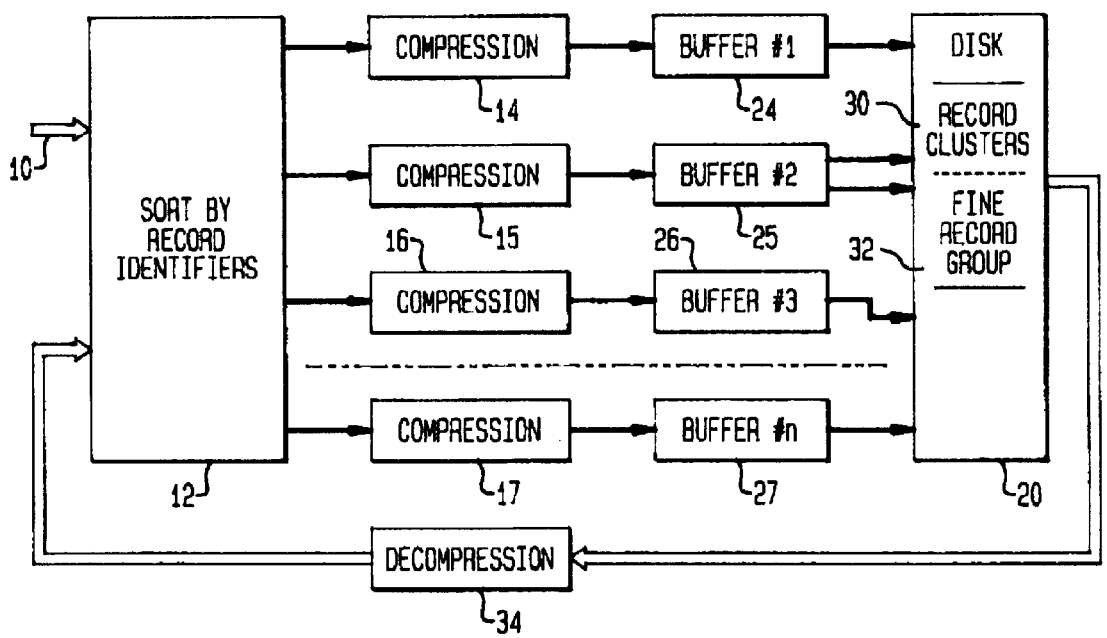
FIG. 2 is a flow diagram illustrating a system where disk storage of compressed records is achieved in stages.

FIG. 2 illustrates a similar system except that the incoming data is transferred to the final disk location in two or more stages. The incoming data stream 10 is sorted in sort routine 12 according to groups of identifiers and stored on disk as record clusters 30. Periodically, the coarse grouping in the record clusters are read from disk, passed through a decompression routine 34, and then supplied to sort routine 12. The sort routine sorts the records according to a smaller group of identifiers. Thus, on each pass through the sort routine the records are separated into a finer record groups, such as fine record group 32, which includes records corresponding to a smaller group of identifiers or a single identifier.

Although the invention is more generally applicable, it will be described in the context of the popular windowed Lempel-Ziv data compression algorithm. The Lempel-Ziv algorithm is described in the article "A Universal Algorithm for Sequential Data Compression" by Jacob Ziv and Abraham Lempel, IEEE Transactions on Information Theory, Vol. IT-23, No. 3, May 1977. The idea behind the Lempel-Ziv algorithm is to select a window size of k bytes, and use the latest k bytes of input data to code the next portion of the incoming data. This next portion of input data is coded in accordance with the longest string for which an exact match is found in the current window being used as a "dictionary", provided this is larger than some threshold. If a match is found, the data is replaced by a pointer to the start of the match and an indicator for the length of the match. If a match is not found, the single character remains. The window is then advanced by the number of characters encoded so that it is once more the last k bytes of input already seen.

Thus, data compression is achieved by detecting data sequences that are repetitive within a certain distance. Where a repetitive sequence is detected, the sequence is replaced by a pointer that points to the prior occurrence and the length of the repetitive sequence.

Figure 3:
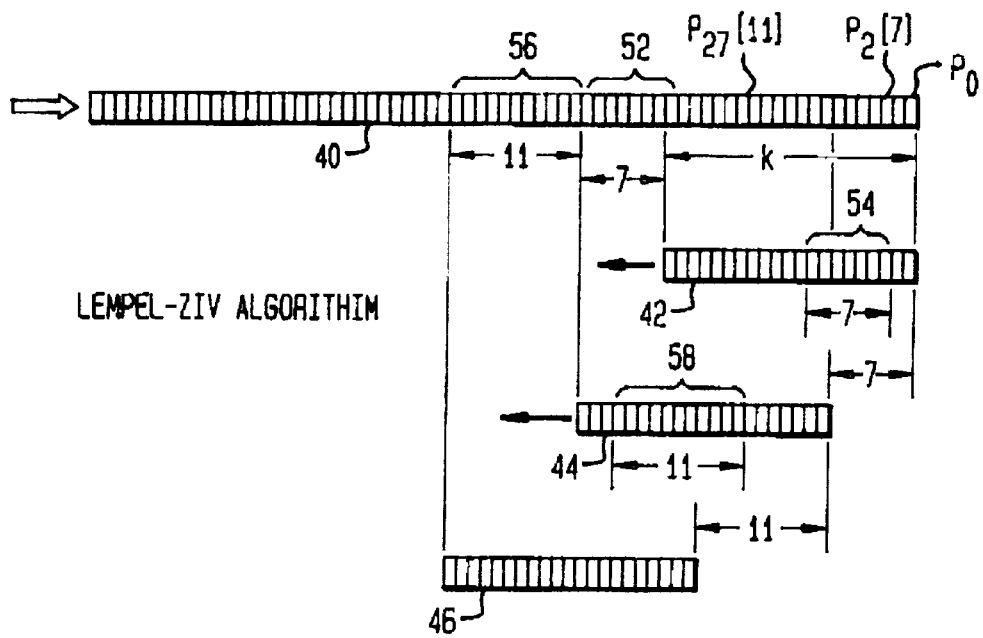
FIG. 3 is a schematic diagram illustrating the operation of the Lempel-Ziv data compression algorithm.

Operation of the Lempel-Ziv algorithm is illustrated in FIG. 3 with respect to an incoming data stream 40 which starts on the right and moves left to right. The initial block of data in data stream 40 is of length k bytes and makes up the initial dictionary 42. In the comparison of the initial dictionary with the following data in the data stream assume that there are seven bytes 52 that are an exact match to seven bytes 54 in the dictionary starting from position $P_2$. Under these circumstances the moving window dictionary moves forward seven places. In other words, the dictionary window advances to include the seven bytes of the prior match and seven bytes fall off the trailing end. After the window has passed the area of the match, the seven bytes are replaced by the pointer to position $P_2$ and by the length seven.

The algorithm continues in this fashion with the window dictionary moving along the data stream according to the length of exact matches and by length/pointer insertions made in place of data matching a moving dictionary sequence. If, for example, after the dictionary is moved seven bytes as a result of the first match, the next eleven bytes 56 in the example are found to be an exact match to eleven bytes 58 in the moving dictionary. These eleven bytes are replaced by a pointer to position $P_{27}$ with a length indication of eleven. Compression continues in this fashion until the end of the data stream is reached.

If the Lempel-Ziv compression algorithm is used in the systems illustrated in FIGS. 1 and 2, a current dictionary must be maintained in memory for each of the output data streams in order to append additional new incoming data records. In large database systems where, for example, records are classified according to millions of customer names, the current dictionaries for each of the multiple output streams can consume tremendous space in the computer main memory. The present invention reduces the memory space required for the current dictionaries which must be maintained so that incoming data can be appended to data previously accumulated.

Figure 4A:
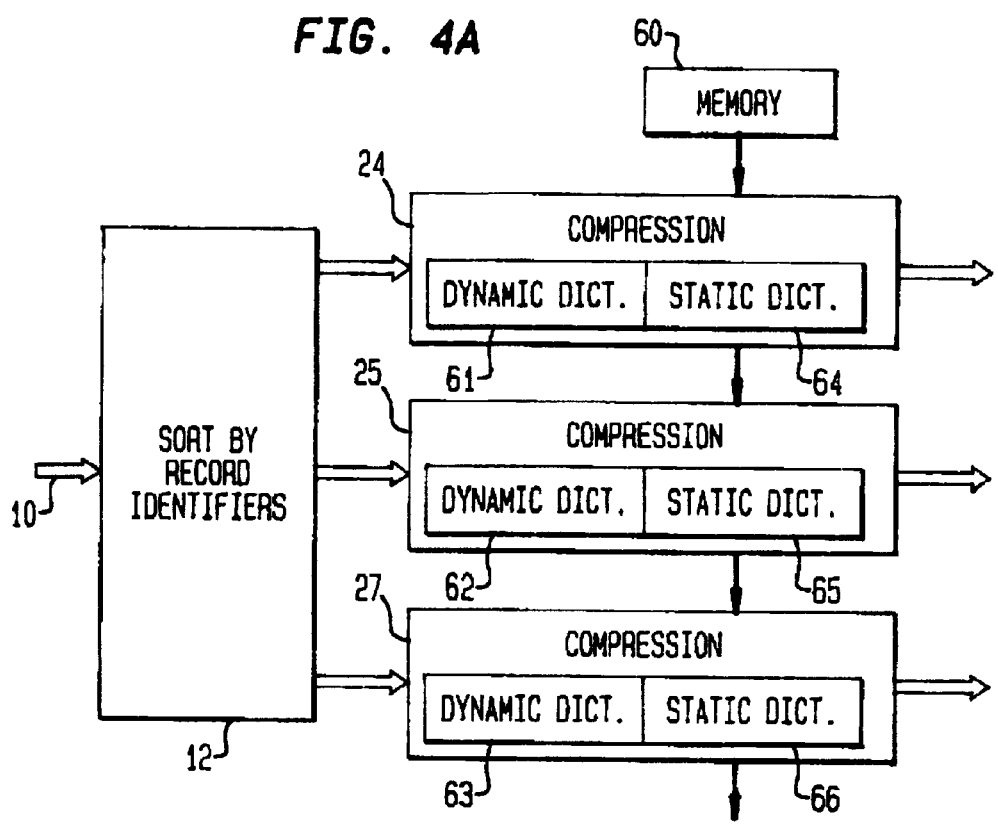
FIG. 4A illustrates a set of compression dictionaries which are partitioned to include a common static sub-dictionary.
Figure 4B:
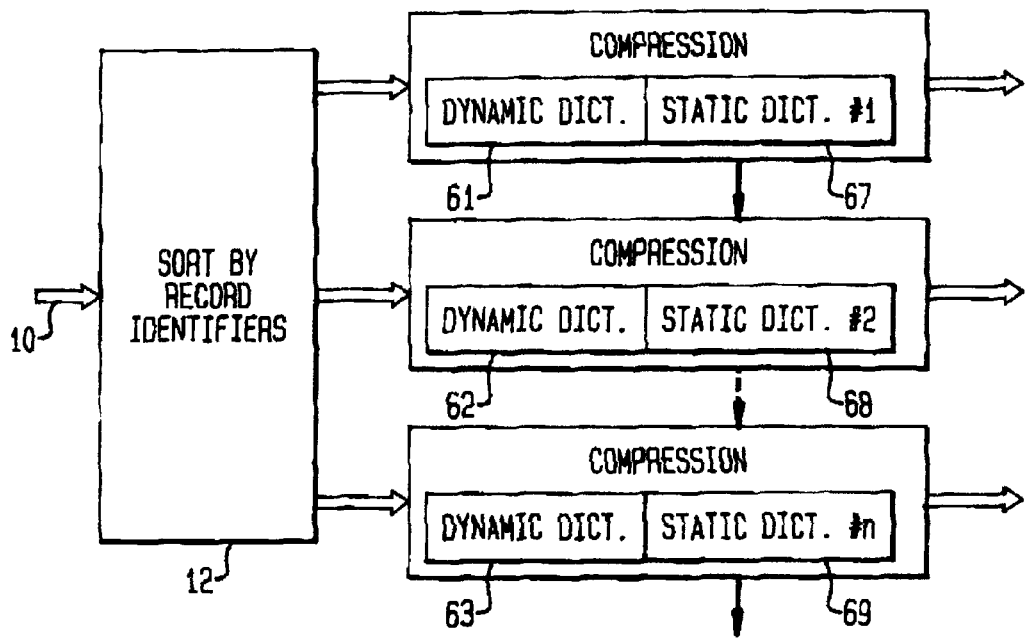
FIG. 4B illustrates a set of compression dictionaries which are partitioned to include a static sub-dictionary local to the data stream being compressed.
Figure 4C:
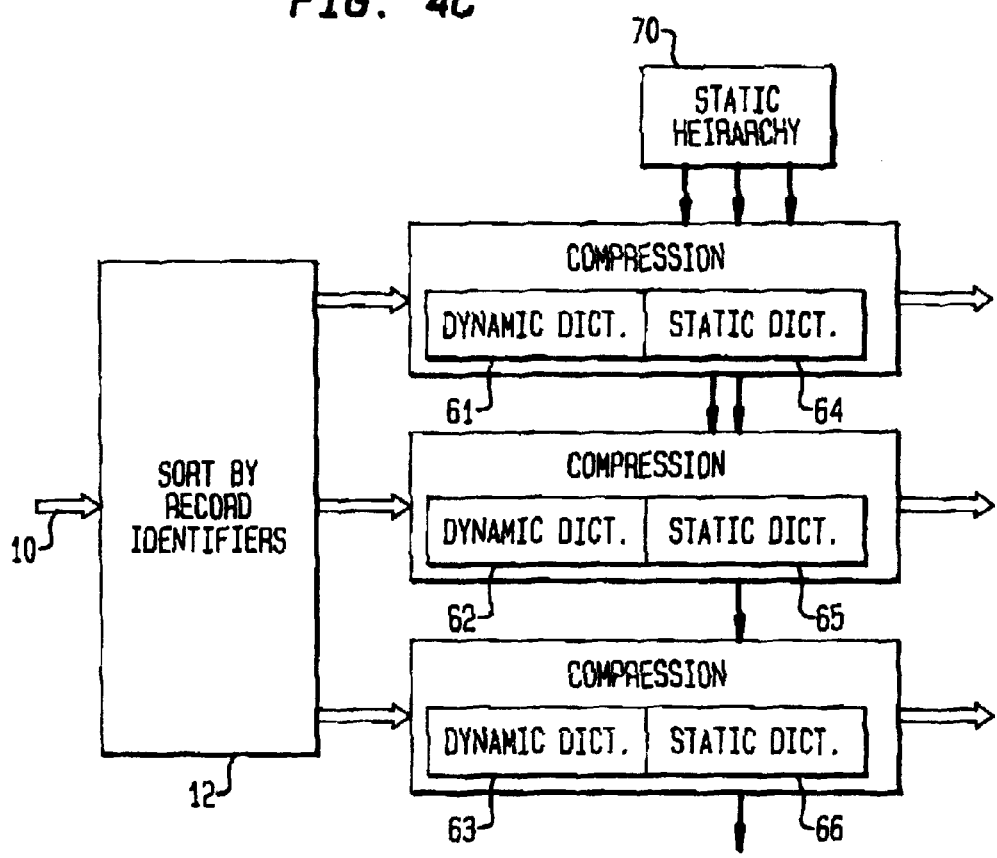
FIG. 4C illustrates a set of compression dictionaries which are partitioned to include a static hierarcical sub-dictionary.

FIGS. 4A, 4B, and 4C illustrate a technique according to the invention whereby the memory space required for the current dictionaries is reduced by partitioning the dictionary so that the current dictionary includes a smaller dynamic portion in combination with a static portion.

FIG. 4A illustrates a system with partitioned current dictionaries including dynamic sub-dictionary parts 61–63 and static sub-dictionary parts 64–66. The dynamic sub-dictionaries are used for compression according to the Lempel-Ziv algorithm. The static sub-dictionaries include data sequences expected to be found in the database and are common to multiple data streams. The static portions of the dictionary can be stored in a common memory location 60 thereby substantially reducing the memory requirements for the current dictionaries. The static sub-dictionary should include substrings likely to have global applications and which exist in most strings being compressed.

In FIG. 4A the incoming data stream 10 passes through a sort routine 12 which sorts the incoming data records into a large number of separate data streams for storage in the associated buffer memories. The data streams are each compressed by the compression routines 24–27. The dynamic sub-dictionary changes according to the Lempel-Ziv algorithm as the compression progresses while the static sub-dictionary remains unchanged. The presence of the static dictionary reduces the size of the dynamic dictionary necessary for effective compression. Since the static sub-dictionary is the same for all data streams and is therefore only stored once in memory 60, the memory required to store all the current dictionaries can be substantially reduced.

FIG. 4B illustrates a similar partitioned current dictionary except that the static sub-dictionaries 67–69 are local for each data stream. Many data streams have some internal commonality, such as a customer name or identifier, which does not depend on position. If these are captured in the static sub-dictionary which does not change, effective data compression can be achieved with a shorter dynamic dictionary.

FIG. 4C illustrates another partitioned dictionary technique wherein the static dictionaries are stored in hierarchical order in a memory 70. As a simple illustration, assume that the hierarchical dictionary 70 includes three subparts, all three of which are used as static sub-dictionary 64 associated with one of the data streams. Only two of the heirarchical subparts are used in static dictionary 66 and only one subpart is used in static dictionary 66. With this arrangement, the subparts not common to the static dictionaries are factored out at each level. The total memory space required for storage of the current dictionaries is reduced because of the common storage of static dictionary subparts in a common memory.

Figure 5A:
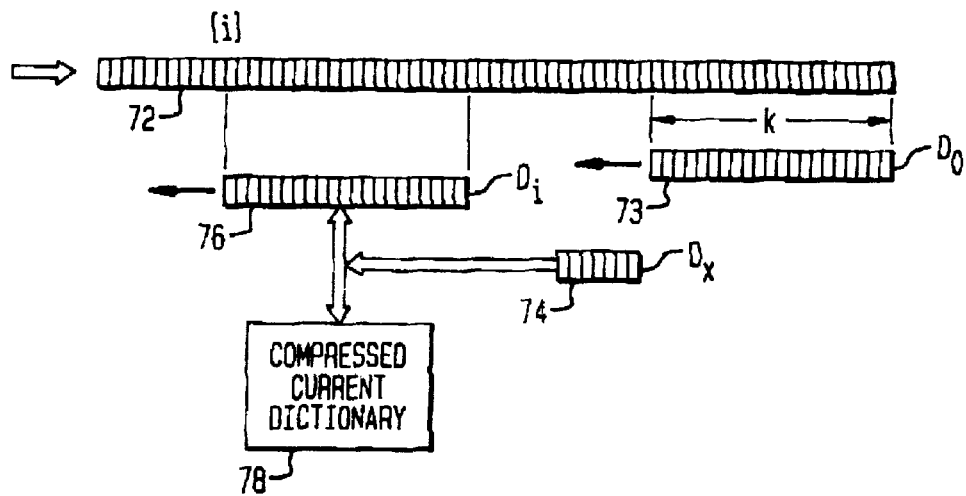
FIG. 5A illustrates a technique for compressing the dictionary used to compress the incoming data stream using a smaller dictionary.
Figure 5B:
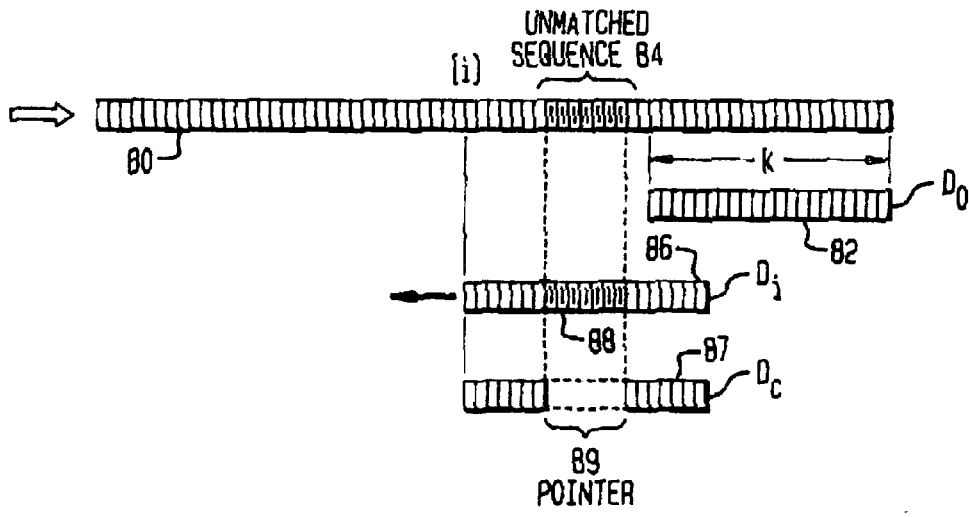
FIG. 5B illustrates a technique for compressing the dictionary replacing non-compressed data in the dictionary with a pointer to the corresponding non-compressed data in the data stream.
Figure 5C:
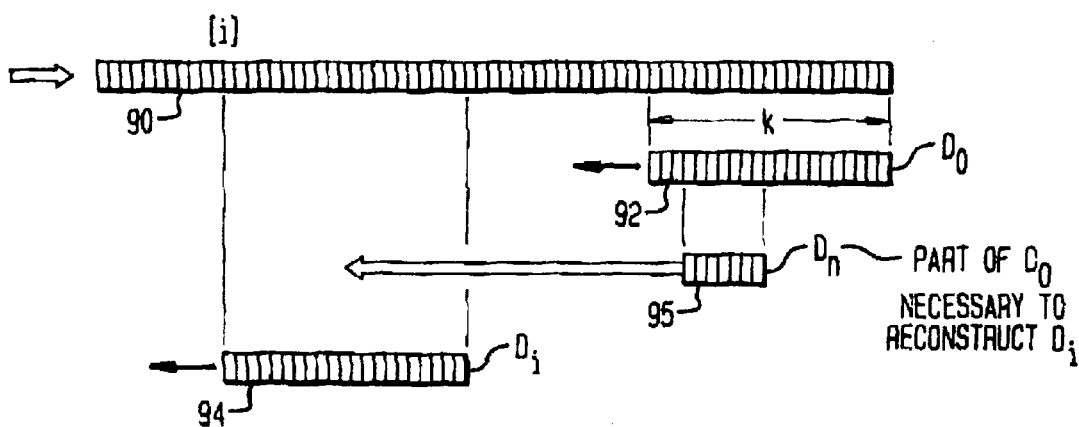
FIG. 5C illustrates a technique for reconstructing the current compression dictionary from the data stream and that portion of the initial dictionary necessary for the reconstruction.

FIGS. 5A, 5B and 5C illustrate techniques according to the invention whereby the memory space required for the current dictionaries is reduced by compressing the dictionaries used for compressing the data streams.

As illustrated in FIG. 5A, the compression algorithm can be applied to the current dictionary 76 by using a smaller dictionary 74 in the process. The current dictionary is stored in compressed form as indicated at 78. With this approach, the current dictionary must be decompressed when accessed. Thus, there is space-time tradeoff. For data streams which are appended to only occasionally, it is worthwhile to keep the current dictionary itself compressed.

Another approach to dictionary compression is illustrated in FIG. 5B where the redundancy of unmatched sequences is eliminated in the compression dictionary. The compressed output often contains unmatched data sequences which were not found in the sliding window dictionary. Not only does the unmatched data sequence appear in the compressed data stream, but it subsequently also appears in the sliding window compression dictionary. Thus, the unmatched data sequences appear twice—once in the current dictionary and once in the compressed output. This redundancy is eliminated according to the technique illustrated in FIG. 5B by replacing unmatched sequences by pointers to the output stream to the extent that parts of the output stream are still in memory.

The incoming data stream 80 moves from left to right with the initial portion of the data stream forming the initial dictionary 82. The sliding window dictionary changes as it moves along the data stream. If sequences are found in the data stream that match data sequences in the sliding window dictionary, the matched sequence is replaced by an appropriate pointer to the dictionary. When, for example, an unmatched sequence 84 is encountered, this data passes through to the output uncompressed. When the sliding dictionary window reaches the point (i) the unmatched sequence 88 will also appear in the current dictionary 86. The redundancy of having the unmatched sequence appear in memory twice is eliminated according to the invention by replacing the unmatched sequence 88 by a pointer 89 to the sequence 84 in the output stream. With this arrangement, it is necessary that part of the data stream that has passed through the compression algorithm be available for decompressing the current dictionary. To avoid the problem, when data is transferred to disk, the current dictionary is decompressed and then recompressed using only those portions of the output data stream that remain in memory.

FIG. 5C illustrates another technique according to the invention which usually provides the most effective dictionary compression. The incoming data stream 90 moves from left to right and the initial portion of the data stream forms the initial dictionary 92. The sliding dictionary changes as it moves along the data stream according to the data encountered. The current dictionary 94 includes the data preceding point (i). Instead of saving the current dictionary, this dictionary is reconstructed from a stored portion of the initial dictionary 95 and the compressed data stream that follows.

Instead of storing the entire initial dictionary for the purpose of reconstructing the current dictionary, only those parts of the initial dictionary that are reachable (either directly or indirectly) from the compressed data corresponding to the current dictionary need be saved. Other parts of the initial dictionary can be filled in by blanks and will have no effect on the reconstruction of the current dictionary. The portion of the initial dictionary that must be kept decreases monotonically as the distance to the point of the reconstruction increases. This can be proven by induction on reachability. Sliding the dictionary window one unit to the left requires that all data generated using it will be data in the window or to the right of the window. Therefore, any path to data in the initial window must pass through a new window. If blanks fill in the portion of the initial dictionary, which is not needed to reconstruct the current dictionary, this will have no effect upon the reconstruction.

The invention has been described according to preferred embodiments in a database system. The invention, however is useful in numerous other applications where data compression can be incorporated. The invention is more particularly defined in the appended claims.

We claim:

1. In a database system, the combination of:
    an incoming data stream including data records to be stored in a non-volatile memory;
    a plurality of output data streams each including data records selected for each respective output data stream according to identifiers in said data records;
    random access memory for accumulating data for periodic write to said non-volatile memory via each of said output streams;
    a current dictionary associated with each of said output data streams, each current dictionary being maintained to compress data records in the incoming data stream and to append said compressed data records from the incoming data stream to the data being accumulated for an output stream associated with the current dictionary, at least a portion of each current dictionary being maintained in a compressed form; and
    means for periodically writing accumulated compressed data records in an output data stream to said non-volatile memory.

2. A database system according to claim 1, wherein each current dictionary is compressed using a moving dictionary shorter than the current dictionary being compressed.

3. A database system according to claim 1, wherein a previously unmatched data sequence in said current dictionary is replaced by a pointer to the unmatched data sequence in the previously compressed data stream.

4. A database system according to claim 1, wherein a compressed portion of a current dictionary that is reachable from the current dictionary is stored in a main memory, and wherein the current dictionary is reconstructed using said stored portion and the incoming data stream.

5. In a database system, the combination of:
   an incoming data stream including data records to be stored in a non-volatile memory;
   a plurality of output data streams each including data records selected for each respective output data stream according to identifiers in said data records;
   random access memory for accumulating data for periodic write to said non-volatile memory via each of said output data streams;
   a current dictionary associated with each of said output data streams, each current dictionary being maintained to compress data records from the incoming data stream and to append said compressed data records in the incoming data stream to the data being accumulated for an output stream associated with the current dictionary, each current dictionary being maintained in a partitioned form including
     a static part that does not change as compression proceeds, and
     a dynamic part that changes as compression progresses; and
   means for periodically writing accumulated compressed data records in an output stream to said non-volatile memory.

6. A database system according to claim 5, wherein said static part of each respective current dictionary is global and is substantially identical for each other current dictionary.

7. A database system according to claim 5, wherein said static part of each respective current dictionary includes dictionary data arranged in a hierarchical order.

8. A database system according to claim 5, wherein said static part of each respective current dictionary is specific for said output stream associated with the current dictionary.

9. A method for storing an incoming data stream in a database system, including the steps of
   receiving an incoming data stream, the incoming data stream including data records to be stored in a non-volatile memory;
   creating a plurality of output data streams, each output data stream including data records selected for each respective output data stream according to identifiers in said data records;
   accumulating data in a random access memory for periodic write to said non-volatile memory via each of said output streams;
   maintaining a current dictionary associated with each output stream, each of said current dictionaries being maintained in a compressed form;
   compressing the data records selected for each respective output data stream in accordance with the current dictionary associated with the output data stream;
   appending the compressed data records for each respective output data stream to the accumulated data for the output data stream; and
   periodically writing accumulated compressed data in an output data stream to said non-volatile memory.

10. A database method according to claim 9, wherein the step of maintaining a current dictionary includes the step of compressing each dictionary associated with each output data stream using a moving dictionary that is shorter than the current dictionary being compressed.

11. A database method according to claim 9, wherein the step of maintaining a current dictionary includes the step of replacing a previously unmatched data sequence in said current dictionary by a pointer to the unmatched data sequence in the incoming data stream.

12. A database method according to claim 9, further comprising the steps of
   storing a compressed portion of the current dictionary that is reachable from the current dictionary in a main memory; and
   reconstructing the current dictionary using said stored portion and the incoming data stream.

13. A method for storing an incoming data stream in a database system, including the steps of
   receiving an incoming data stream, the incoming data stream including data records to be stored in a non-volatile memory;
   creating a plurality of output data streams, each output data stream including data records selected for each respective output data stream according to identifiers in said data records;
   accumulating data in a random access memory for periodic write to said non-volatile memory via each of said output streams;
   maintaining a current dictionary associated with each output stream, each of said current dictionaries being maintained in a partitioned form including a static part that does not change as compression proceeds, and a dynamic part that changes as compression progresses;
   compressing the data records selected for each respective output data stream in accordance with the current dictionary associated with the output data stream;
   appending the compressed data records for each respective output data stream to the accumulated data for the output data stream; and
   periodically writing accumulated compressed data in an output data stream to said non-volatile memory.

14. A database method according to claim 13, wherein said static part of each respective current dictionary is global and is substantially identical for each other current dictionary.

15. A database method according to claim 13, further comprising the step of selecting said static part of each respective current dictionary according to expected data sequences in the output data stream associated with the current dictionary.

16. A database method according to claim 13, wherein the static part of a current dictionary includes a hierarchy in which all portions of said static part hierarchy common to the current dictionaries are included a higher level in the hierarchy.

17. A method for storing an incoming data stream in a database system, including the steps of
   (1) receiving an incoming data stream, the incoming data stream including data records to be stored in a non-volatile memory;
   (2) creating a plurality of output data streams, each output data stream including data records selected for each respective output data stream according to identifiers in said data records;

(3) accumulating data in a random access memory for periodic write to said non-volatile memory via each of said data output streams when the accumulated data for an output data stream exceeds a predetermined amount;

(4) maintaining a current dictionary associated with each output stream;

(5) compressing the data records selected for each respective output data stream in accordance with the current dictionary associated with the output data stream;

(6) appending the compressed data records for each respective output data stream to the accumulated data for the output data stream;

(7) periodically writing accumulated compressed data in an output data stream to said non-volatile memory as an identifier group;

(8) periodically reading compressed data for one of said identifier groups;

(9) decompressing the identifier group periodically read as an identifier group;

(10) supplying the decompressed identifier group as the incoming data stream in step (1); and

(11) repeating steps (2) through (7) to divide the data for the identifier group into more detailed groups of identifiers for storage in said non-volatile memory.

* * * * *